US008866656B2

(12) United States Patent
Chiang et al.

(10) Patent No.: US 8,866,656 B2
(45) Date of Patent: Oct. 21, 2014

(54) HYBRID DIGITAL-TO-ANALOG CONVERTER AND METHOD THEREOF

(71) Applicant: Realtek Semiconductor Corp., Hsinchu (TW)

(72) Inventors: Ming-Cheng Chiang, Hsinchu (TW); Li-Lung Kao, New Taipei (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 14/098,579

(22) Filed: Dec. 6, 2013

(65) Prior Publication Data
US 2014/0167993 A1    Jun. 19, 2014

(30) Foreign Application Priority Data

Dec. 14, 2012  (TW) .............................. 101147348 A

(51) Int. Cl.
*H03M 3/00* (2006.01)
*H03M 1/08* (2006.01)
*H03M 1/74* (2006.01)
*H03M 1/00* (2006.01)
*G09G 3/36* (2006.01)

(52) U.S. Cl.
CPC .............. *H03M 1/089* (2013.01); *H03M 1/747* (2013.01); *H03M 1/00* (2013.01); *G09G 3/3648* (2013.01); *H03M 3/30* (2013.01)

USPC .......................................... 341/143; 341/144

(58) Field of Classification Search
CPC ......... H03M 1/747; H03M 1/00; H03M 3/30; G09G 3/3648
USPC ...................... 341/143, 144, 150, 145; 345/87
See application file for complete search history.

(56) References Cited

U.S. PATENT DOCUMENTS

2007/0090981 A1*   4/2007  Chou ............................ 341/144

* cited by examiner

*Primary Examiner* — Joseph Lauture
(74) *Attorney, Agent, or Firm* — McClure, Qualey & Rodack, LLP

(57) ABSTRACT

Hybrid digital-to-analog converter and method thereof are provided. The hybrid digital-to-analog converter (DAC) includes a data processor, at least one first type DAC, at least one second type DAC, and an output circuit. The data processor processes an input digital signal to output at least one of first and second digital signals which are related to a higher bit portion and a lower bit portion of the input digital signal, respectively. If the data processor outputs the first digital signal to the first type DAC, the first type DAC converts the first digital signal. The at least one second type DAC receives and converts the second digital signal outputted from the data processor. The output circuit receives at least one output signal of the first and the second type DACs to output an output analog signal.

14 Claims, 1 Drawing Sheet

HYBRID DIGITAL-TO-ANALOG CONVERTER AND METHOD THEREOF

This application claims the benefit of Taiwan application Serial No. 101147348, filed Dec. 14, 2012, the subject matter of which is incorporated herein by reference.

BACKGROUND OF THE INVENTION

1. Field of the Invention

The invention relates to a hybrid digital-to-analog converter and a method thereof.

2. Description of the Related Art

Digital-to-analog converters (DACs) play an important role in modern electronic or communication system. The quality of the DAC may intensively affect the whole performance of the electronic or communication system.

The DAC processes not only digital signals with larger voltage swing, but also small signals. It is inevitable that the currently available DAC is required to handle the issue of non-linear distortion when processing digital signals with large voltage swing, and to be designed considering the issues of power dissipation and circuit area.

Thus, the disclosure in the following provides a hybrid digital-to-analog converter, concerned with the above issues.

SUMMARY OF THE INVENTION

The disclosure is directed to a hybrid digital-to-analog converter and a method thereof. In an embodiment, large signals are processed mainly by a switched capacitance digital-to-analog converter, which is suitable for processing large signals. In addition, small signals are processed mainly by a current-steering digital-to-analog converter, which is suitable for processing small signals.

According to an exemplary embodiment of the disclosure, a hybrid digital-to-analog converter is provided. The hybrid digital-to-analog converter includes a data processor, at least one first type digital-to-analog converter, at least one second type digital-to-analog converter, and an output circuit. The data processor processes an input digital signal to output at least one of a first digital signal and a second digital signal, wherein the first digital signal and the second digital signal are related to a higher bit portion and a lower bit portion of the input digital signal, respectively. The at least one first type digital-to-analog converter is coupled to the data processor, wherein if the data processor outputs the first digital signal to the first type digital-to-analog converter, the first type digital-to-analog converter converts the first digital signal. The at least one second type digital-to-analog converter, coupled to the data processor, is used for receiving and converting the second digital signal outputted from the data processor. The output circuit, coupled to the first type digital-to-analog converter and the second type digital-to-analog converter, is used for receiving at least one output signal of the first type and the second type digital-to-analog converters to output an output analog signal.

According to another exemplary embodiment of the disclosure, a hybrid digital-to-analog conversion method is provided, including the following. (a) An input digital signal is processed to obtain at least one of a first digital signal and a second digital signal, wherein the first digital signal and the second digital signal are related to a higher bit portion and a lower bit portion of the input digital signal, respectively. (b) A first type digital-to-analog conversion is performed on the first digital signal if the step (a) obtains the first digital signal. (c) A second type digital-to-analog conversion is performed on the second digital signal. (d) At least one output signal by the first type and the second type digital-to-analog conversion is received to output an output analog signal.

The above and other aspects of the invention will become better understood with regard to the following detailed description of the preferred but non-limiting embodiment(s). The following description is made with reference to the accompanying drawings.

DETAILED DESCRIPTION OF THE INVENTION

In an embodiment of the disclosure, a hybrid digital-to-analog converter includes different types of digital-to-analog converters (DACs), such as, without limited to, current-steering DACs and switched capacitance DACs. In the process for large digital signals, a switched capacitance DAC is employed to process large signals so as to achieve high linearity. In addition, in the process for small digital signals, a current-steering DAC is utilized for processing small signals, thus reducing the required number of chips of current source, the required area, and power dissipation.

Figure 1:
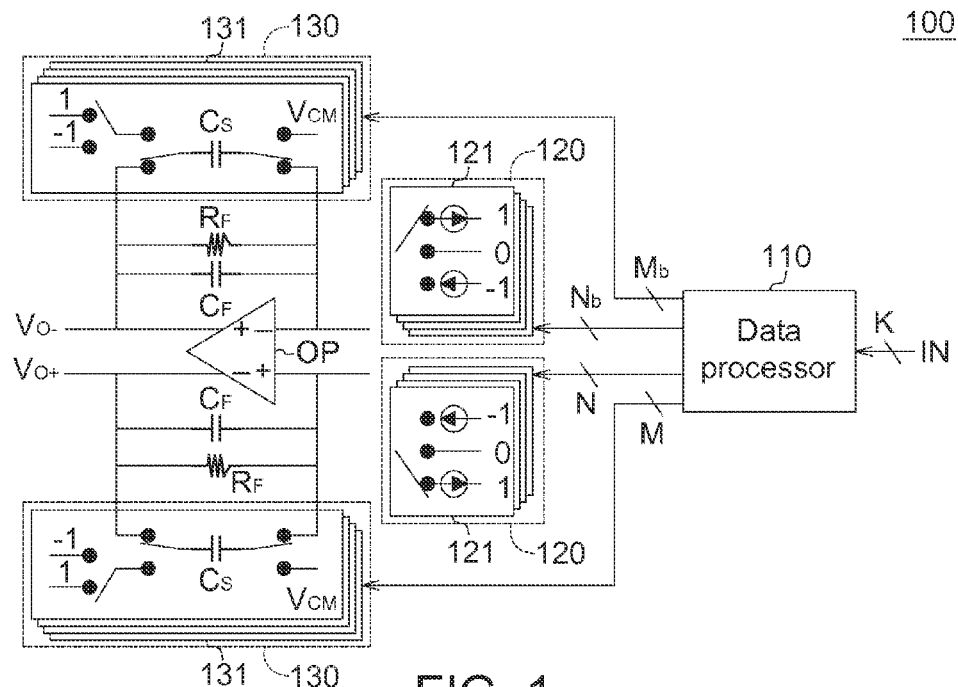
FIG. 1 is a block diagram illustrating a hybrid digital-to-analog converter 100 according to an embodiment of the disclosure.

Referring to FIG. 1, a hybrid digital-to-analog converter 100 is illustrated according to an embodiment in a block diagram. As shown in FIG. 1, the hybrid digital-to-analog converter 100 includes: a data processor 110, a current-steering DAC 120, a switched capacitance DAC 130, an operating amplifier OP, a plurality of resistors $R_F$, and a plurality of capacitors $C_F$, wherein $V_{CM}$ is a common mode voltage, an Vo+ an Vo− are the outputs of the hybrid digital-to-analog converter 100. The operating amplifier OP, resistors $R_F$, and capacitors $C_F$ can be referred to as an output circuit. The current-steering DAC 120 includes a plurality of switching current units 121; and the switched capacitance DAC 130 includes a plurality of switched capacitance units 131.

In FIG. 1, while the hybrid digital-to-analog converter 100 is exemplified by a fully-differential hybrid digital-to-analog converter for the sake of explanation, it is to be understood that the disclosure is not limited thereto. In other embodiments, the hybrid digital-to-analog converter can be implemented by using a single-ended hybrid digital-to-analog converter. One ordinary skill in the art can derive the implementation of the hybrid digital-to-analog converter with a single-ended hybrid digital-to-analog converter, according to the specification and its spirit. All the embodiments according to the specification and its spirit are included in the scope of the disclosure.

The data processor 110 is used for processing an input digital signal IN to obtain a higher bit group M and a lower bit group N. Signals Mb and Nb are inverted bits of the higher bit group M and the lower bit group N, respectively. How the data processor 110 processes the input digital signals to obtain the high bit group M and the low bit group N will be described later. For the sake of convenience of naming, the bit group M and Mb are referred to as higher bit groups and the bit group N and Nb are referred to as lower bit groups.

The current-steering DAC 120 performs digital-to-analog conversion on the lower bit groups N and Nb transmitted from the data processor 110. In general, the current-steering DAC, when processing signals with larger voltage swing, has its resistance easily varying with the voltage variation due to the high sensitivity of the resistance to voltage, thus causing serious non-linear distortion. In addition, in high signal-to-noise ratio (SNR) applications (SNR is measured in a small signal mode), a current source is required to occupy a lot of circuit area so as to reduce the mismatch of current sources and flicker noise. Further, the current-steering DAC 120 has a circuit bandwidth of $1/(2\pi*(1/(R_F*C_F)))$.

The switched capacitance DAC 130, when processing large signals, has better linearity since the sensitivity of its internal circuitry to voltage is low. However, in high SNR applications, the switched capacitance DAC 130 requires a high cost of circuit area. Since the thermal noise (KT/C noise) relates to the internal capacitance $C_S$ of the switched capacitance DAC 130, the area of the capacitance $C_S$ has to be larger so as to reduce the thermal noise. Besides, the area of the capacitance $C_F$ has a multiple relationship with the capacitance $C_S$, and the capacitance $C_F$ is far greater than the capacitance $C_S$. The area of the capacitance $C_F$ is then very large, making the whole area fairly large. In addition, the switched capacitance DAC 130 has a bandwidth of $k*(C_S/C_F)*F_S$, wherein k is a constant, and $F_S$ is a sampling frequency.

Accordingly, in the embodiment, in the processing of large signals, large signals are processed mainly by the switched capacitance DAC 130. This is because the capacitance of the switched capacitance DAC 130 has a low sensitivity to voltage, thus achieving the requirement for high linearity. In the embodiment, in the processing of small signals (e.g., measuring SNR in a small signal mode), small signals are processed mainly by the current-steering DAC 120. It is because the current variation of the small signal is small relatively, the number of chips of current source is small, and the area is also small.

The capacitance $C_F$ can be regarded as a part of a low pass filter, coupled between the input and output terminals of the operating amplifier OP.

Figure 2:
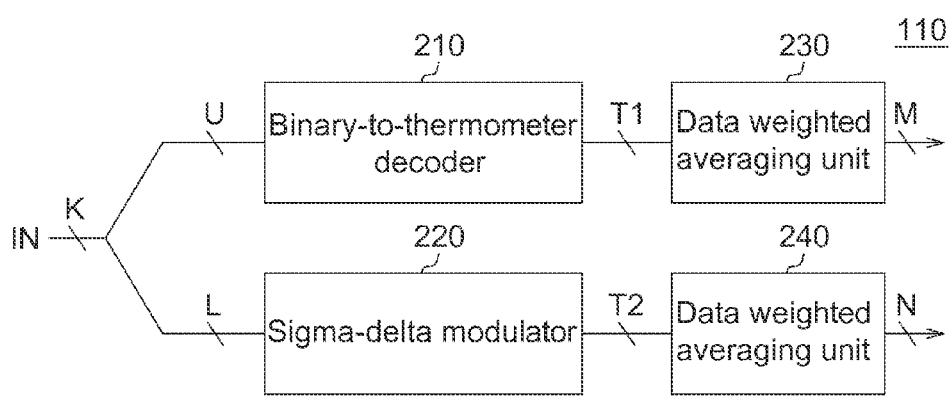
FIG. 2 is a functional block diagram illustrating the data processor 110 according to an embodiment of the disclosure.

The structure and operation of the data processor 110 is described according to an embodiment. Referring to FIG. 2, the data processor 110 is illustrated according to the embodiment in a functional block diagram. The data processor 110 as illustrated in FIG. 2, for example, is applied to an oversampling system, and it is understood the embodiment is not limited thereto. In the embodiment, the data processor 110 includes: a binary-to-thermometer decoder 210, and a sigma-delta modulator (SDM) 220, data weighted averaging (DWA) units 230 and 240.

As an example, the input digital signal IN indicates 24-bit binary digital data. First, the data processor 24 divides the 24-bit digital signal into two portions: one portion is a digital signal U of 6 bits (which are high bits) and the other portion is a digital signal L of 18 bits (which are low bits). While the input digital signal of other number of bits can be processed and the input digital signal can be divided in different ways, it is understood that the embodiment is not limited thereto.

The 6-bit digital signal U is decoded by the binary-to-thermometer decoder 210 into a thermometer code T1, wherein the thermometer code T1 can represent 0 to 63 levels, for example, and it is understood that the embodiment is not limited thereto. The binary-to-thermometer decoding is not limited in detail here, and can be implemented in different ways. It is also understood that the number of levels that the thermometer code T1 can represent is not limited thereto. In addition, the number of the switched capacitance units 131 included in the switched capacitance DAC 130 can be equal to or related to the number of levels that the thermometer code T1 can represent.

The 18-bit digital signal L is decoded by the SDM 220 into a thermometer code T2, wherein the thermometer code T2 can represent 0 to 3 levels, for example, and it is understood that the embodiment is not limited thereto. The sigma-delta modulation is not limited in detail here, and can be implemented in different ways. It is also understood that the number of levels that the thermometer code T2 can represent is not limited thereto. In addition, the number of the switching current units 121 included in the current steering DAC 120 can be equal to or related to the number of levels that the thermometer code T2 can represent.

The data weighted averaging units 230 and 240 perform data weighted averaging on the first thermometer code T1 and the second thermometer code T2 to generate the higher bit groups (M and Mb) and the lower bit groups (N and Nb). The data weighted averaging is not limited in detail here, and can be implemented in different ways. After the data weighted averaging, the higher bit groups (M and Mb) can represent 0 to 63 levels and the lower bit groups (N and Nb) can represent 0 to 3 levels, for example.

Accordingly, the higher bit groups (M and Mb) and the lower bit group (N and Nb) obtained as above can facilitate the whole DAC linearity, so that the hybrid digital-to-analog converter of the embodiment provides better linearity.

In addition, a converted voltage corresponding to one level in the lower bit groups (N and Nb) is equal to a converted voltage corresponding to one level in the higher bit groups (M and Mb).

When performing digital-to-analog conversion, the hybrid digital-to-analog converter of the embodiment performs digital-to-analog conversion on the signal N if it is determined that the input signal is a small signal, or performs digital-to-analog conversion on both the signals M and N if it is determined that the input signal is a large signal.

It will be explained in the following. If the data processor 110 determines that the input digital signal IN is greater than a threshold value, (e.g., the input digital signal is of 24 bits, and the threshold value can be set to 000000111111111111111111), that is, the data processor 110 determines that the input digital signal IN is a large signal, the data processor 110 then outputs the signals M and Mb to the switched capacitance DAC 130, so that the switched capacitance DAC 130 performs digital-to-analog conversion on the signals M and Mb. In this situation, the data processor 110 sends the signals N and Nb to the current-steering DAC 120.

Conversely, if the data processor 110 determines that the input digital signal IN is smaller than or equal to the threshold value, that is, the data processor 110 determines that the input digital signal IN is a small signal, the data processor 110 then outputs the signals N and Nb to the current-steering DAC 120, so that the current-steering DAC 120 performs digital-to-analog conversion on the signals N and Nb. In this situation, there are no signals M and Mb, and the data processor 110 will not send the signals M and Mb to the switched capacitance DAC 130.

As exemplified above, if the data processor 110 determines that the input digital signal IN is smaller than or equal to the threshold value, the input digital signal IN is a small signal; if the data processor 110 determines that the input digital signal IN is greater than the threshold value, the input digital signal IN is a large signal. In other embodiments, if the data processor 110 determines that the input digital signal IN is smaller than the threshold value, the input digital signal IN is a small signal; if the data processor 110 determines that the input digital signal IN is greater than or equal to the threshold value, the input digital signal IN is a large signal.

The data processor 110 controls the switching current units 121 of the current-steering DAC 120 according to the signals N and Nb. Specifically, the data processor 110 controls, for example, the switching of internal switches of the switching current units 121 of the current-steering DAC 120 according to the signals N and Nb. Likewise, the data processor 110 controls the switched capacitance units 131 of the switched capacitance DAC 130 according to the signals M and Mb. Specifically, the data processor 110 controls, for example, the switching of internal switches of the switched capacitance units 131 of the switched capacitance DAC 130 according to the signals M and Mb.

The hybrid digital-to-analog converter of the embodiment can be applied to any electronic system with DAC(s), such as, an analog-to-digital converter (ADC) having DAC(s), a communication system, and so on, without limited thereto.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A hybrid digital-to-analog converter, comprising:
    a data processor, for processing an input digital signal to output at least one of a first digital signal and a second digital signal, wherein the first digital signal and the second digital signal are related to a higher bit portion and a lower bit portion of the input digital signal, respectively;
    at least one first type digital-to-analog converter, coupled to the data processor, wherein if the data processor outputs the first digital signal to the first type digital-to-analog converter, the first type digital-to-analog converter converts the first digital signal;
    at least one second type digital-to-analog converter, coupled to the data processor, for receiving and converting the second digital signal outputted from the data processor; and
    an output circuit, coupled to the first type digital-to-analog converter and the second type digital-to-analog converter, for receiving at least one output signal of the first type and the second type digital-to-analog converters to output an output analog signal.

2. The hybrid digital-to-analog converter according to claim 1, wherein the data processor, according to a threshold value, processes the input digital signal to output the first digital signal and the second digital signal, or processes the input digital signal to output the second digital signal.

3. The hybrid digital-to-analog converter according to claim 2, wherein if the data processor determines that the input digital signal is smaller or equal to the threshold value, the data processor outputs the second digital signal to the second type digital-to-analog converter but does not output the first digital signal to the first type digital-to-analog converter.

4. The hybrid digital-to-analog converter according to claim 1, wherein
    the first type digital-to-analog converter comprises a switched capacitance digital-to-analog converter which comprises a plurality of switched capacitance units; and
    the second type digital-to-analog converter comprises a current-steering digital-to-analog converter which comprises a plurality of switching current units.

5. The hybrid digital-to-analog converter according to claim 4, wherein:
    the data processor controls the switched capacitance units of the switched capacitance digital-to-analog converter according to the first digital signal; and
    the data processor controls the switching current units of the current-steering digital-to-analog converter according to the second digital signal.

6. The hybrid digital-to-analog converter according to claim 4, wherein the data processor comprises:
    a binary-to-thermometer decoder, for decoding the higher bit portion of the input digital signal into a first thermometer code, wherein the first thermometer code has a first level;
    a sigma-delta modulator, for decoding the lower bit portion of the input digital signal into a second thermometer code, wherein the second thermometer code has a second level; and
    a plurality of data weighted averaging units, coupled to the binary-to-thermometer decoder and the sigma-delta modulator, for performing data weighted averaging on the first thermometer code and the second thermometer code to generate the first digital signal and the second digital signal.

7. The hybrid digital-to-analog converter according to claim 6, wherein number of the switched capacitance units is related to the first level of the first thermometer code; and number of the switching current units is related to the second level of the second thermometer code.

8. A hybrid digital-to-analog conversion method, comprising:
    (a) processing an input digital signal to obtain at least one of a first digital signal and a second digital signal, wherein the first digital signal and the second digital signal are related to a higher bit portion and a lower bit portion of the input digital signal, respectively;
    (b) performing a first type digital-to-analog conversion on the first digital signal if the step (a) obtains the first digital signal;
    (c) performing a second type digital-to-analog conversion on the second digital signal; and
    (d) receiving at least one output signal by the first type and the second type digital-to-analog conversion to output an output analog signal.

9. The hybrid digital-to-analog conversion method according to claim 8, wherein in the step (a), according to a threshold value, the input digital signal is processed to obtain the first digital signal and the second digital signal, or to obtain the second digital signal.

10. The hybrid digital-to-analog conversion method according to claim 9, wherein if it is determined that the input digital signal is smaller or equal to the threshold value, the step (c) is performed on the second digital signal but the step (b) is not performed on the first digital signal.

11. The hybrid digital-to-analog conversion method according to claim 8, wherein:
    the step (b) is performed by a switched capacitance digital-to-analog converter which comprises a plurality of switched capacitance units; and
    the step (c) is performed by a current-steering digital-to-analog converter which comprises a plurality of switching current units.

12. The hybrid digital-to-analog conversion method according to claim 11, wherein:
    the switched capacitance units of the switched capacitance digital-to-analog converter are controlled according to the first digital signal; and the switching current units of the current-steering digital-to-analog converter are controlled according to the second digital signal.

13. The hybrid digital-to-analog conversion method according to claim 11, wherein the step (a) comprises:
   decoding the higher bit portion of the input digital signal into a first thermometer code, wherein the first thermometer code has a first level;
   decoding the lower bit portion of the input digital signal into a second thermometer code, wherein the second thermometer code has a second level; and
   performing data weighted averaging on the first thermometer code and the second thermometer code to generate the first digital signal and the second digital signal.

14. The hybrid digital-to-analog conversion method according to claim 13, wherein number of the switched capacitance units is related to the first level of the first thermometer code; and number of the switching current units is related to the second level of the second thermometer code.

* * * * *